United States Patent
Sawai et al.

(10) Patent No.: US 6,600,525 B1
(45) Date of Patent: Jul. 29, 2003

(54) ELECTRONIC COMPONENT HAVING A LIQUID CRYSTAL DISPLAY AND HOLDING A BUILT-IN BATTERY

(75) Inventors: Daisuke Sawai, Kyoto (JP); Tadahiko Ogawa, Kyoto (JP); Hajime Takakuwa, Kyoto (JP); Moriaki Koyama, Kyoto (JP); Tomonori Hishikawa, Kyoto (JP); Takayuki Arai, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/450,711

(22) Filed: Nov. 30, 1999

(65) Prior Publication Data (65)

(30) Foreign Application Priority Data

Nov. 30, 1998 (JP) .......................................... 10-339932
Dec. 4, 1998 (JP) .......................................... 10-345798

(51) Int. Cl.⁷ .......................................... G02F 1/1333
(52) U.S. Cl. .......................... 349/58; 361/681; 429/100
(58) Field of Search ........................ 349/58, 65; 429/96, 429/100; 361/752, 681; 206/704

(56) References Cited

U.S. PATENT DOCUMENTS

| | | | | |
|---|---|---|---|---|
| 3,986,335 A | * | 10/1976 | Harper | 368/63 |
| 4,165,607 A | | 8/1979 | Fedorowicz et al. | 58/50 R |
| 4,294,517 A | * | 10/1981 | Jakubek | 349/70 |
| 4,635,354 A | * | 1/1987 | Chrobak et al. | 29/622 |
| 4,755,035 A | | 7/1988 | Kopish et al. | 350/345 |
| 4,797,542 A | * | 1/1989 | Hara | 235/380 |
| 5,039,580 A | * | 8/1991 | Mori | 429/97 |
| 5,188,912 A | * | 2/1993 | Katoh et al. | 429/100 |
| 5,402,095 A | * | 3/1995 | Janniere | 200/292 |
| 5,438,482 A | * | 8/1995 | Nakamura et al. | 361/816 |
| 5,529,503 A | * | 6/1996 | Kerklaan | 439/76.1 |
| 5,552,240 A | * | 9/1996 | Derstine | 429/96 |
| 5,590,028 A | * | 12/1996 | Duncan | 257/679 |
| 5,636,270 A | * | 6/1997 | Davey | 379/350 |
| 5,654,111 A | * | 8/1997 | Minomiya et al. | 429/162 |
| 5,777,316 A | * | 7/1998 | Horie et al. | 235/486 |
| 5,843,595 A | * | 12/1998 | Kawakatsu | 220/326 |
| 5,940,153 A | * | 8/1999 | Castanedda et al. | 349/58 |
| 6,062,901 A | * | 5/2000 | Liu et al. | 429/100 |

FOREIGN PATENT DOCUMENTS

| | | |
|---|---|---|
| EP | 0 604 138 | 6/1994 |
| EP | 0 745 966 | 12/1996 |
| GB | 2 264 583 | 9/1993 |

* cited by examiner

Primary Examiner—Kenneth Parker
(74) Attorney, Agent, or Firm—Foley & Lardner

(57) ABSTRACT

In an electronic component including an outer housing and a control unit inserted within the outer housing, the control unit includes a base, a printed circuit board mounted on the base, a battery holder mounted on the base for removably holding a coin-shaped battery which includes terminals connected with the printed circuit board to be connected with positive and negative poles of the battery, a liquid crystal display mounted on the base and connected with the printed circuit board, and a backlight unit mounted on the base and connected with the printed circuit board, whereby the battery may be easily replaced and the insulation distance between the battery and electronic parts on the printed circuit board is sufficiently ensured and a broad space may be ensured for arrangement of the electronic parts on the printed circuit board.

11 Claims, 8 Drawing Sheets

ELECTRONIC COMPONENT HAVING A LIQUID CRYSTAL DISPLAY AND HOLDING A BUILT-IN BATTERY

BACKGROUND OF THE INVENTION

1. Field of the Invention

This invention relates to an electronic component, and, more particularly, to an improved control component such as a counter device.

2. Description of the Related Art

FIG. 10 at (1) and (2) shows an electronic counter device 70 as a conventional electronic component, which includes an outer housing 71 and an internal control unit 72. The internal control unit 72 includes a front module 73, a printed circuit board 74, a battery install unit 75, and a terminal block 76 provided with four terminals 77. Lead portions 77a of the terminals 77 are projected forwardly from the terminal block 76 to be connected with the printed circuit board 74. The board 74 on a rear side wall thereof is mounted by a positive pole connection plate 78 and a negative pole connection plate 79 to provide the battery install unit 75 in which a battery 80 is mounted by bringing its positive and negative poles into contact with the positive and negative pole connection plates 78 and 79 respectively.

The front module 73 is provided with a transparent housing member 81, a liquid crystal display (LCD) 82, and a backlight unit 83. The LCD 82 and the backlight unit 83 are put together and housed within the housing member 81. The front module 73 is mounted into the printed circuit board 74 by engaging a hook portion (not shown in the drawings) of the housing member 81 with a peripheral portion of the board 74, and the LCD unit 82 and the backlight unit 83 are electrically connected with the board 74 to provide the control unit 72 housed within the outer housing 71.

The conventional counter device 70 has the construction that the printed circuit board 74 is connected with the lead portions 77a of the four terminals 77 disposed in the terminal 76, and the positive and negative pole plates 78 and 79 are mounted on the rear wall of the printed circuit board 74 to provide the battery install unit 75 installed by the battery 80. Accordingly, the device 70 has the disadvantages that the replacement of the battery 80 is not easy, there cannot be ensured any sufficient distance for insulation from the battery 80 to the printed circuit board 74 and the electronic parts on the board 74, and the electronic parts have to be arranged on the board 74 by taking unfavorable space so as to ensure the distance for insulation against the battery 80.

A front section of the internal control unit is constituted with the front module 73 in which the LCD 82 and the backlight unit 83 are put together and housed within the housing member 81, resulting in the increase of the number of parts, taking unfavorably long time in its assembly process, and the increase of the manufacturing cost.

SUMMARY OF THE INVENTION

It is, therefore, a primary object of this invention to provide an electronic component in which the arrangement of electronic parts on a printed circuit board for ensuring the insulation distance against a battery is not required, flexible design is accommodated by enlargement of use area on the printed circuit board, any front module is not necessary, the number of parts is reduced, the time for assembling is reduced, and the manufacturing cost is reduced.

According to a first aspect of this invention, there is provided an electronic component having an outer housing and a control unit inserted within the outer housing, and the control unit includes a base, a printed circuit board mounted on the base, a battery holder mounted on the base for removably holding a coin-shaped battery and provided with terminals connected to the printed circuit board for connection with positive and negative poles of the battery, a liquid crystal display mounted on the base and connected with the printed circuit board, and a backlight mounted on the base and connected with the printed circuit board. The base is provided with the printed circuit board and the battery holder for holding the battery, whereby the battery may be easily replaced and the insulation distance between the battery and the electronic parts on the printed circuit board is sufficiently ensured, the arrangement of electronic parts to ensure the sufficient insulation distance from the battery is not required on the printed circuit board, and any broad space is not necessary in the arrangement of the electronic parts. Thus, the degree of freedom in designing is increased by expansion of use area on the printed circuit board. The installation of the LCD and the backlight unit into the base may omit any front module, and decrease the number of parts, thereby reducing the manufacturing cost without wasting time in the assembly process.

According to a second aspect of this invention, the electronic component of the first aspect is so modified that the base is provided with a base portion and a terminal block, and the base portion includes a battery holder mount portion for mounting the battery holder, a board mount portion for mounting the printed circuit board, a LCD mount portion for mounting the LCD, and a backlight mount portion for mounting the backlight. The modified electronic component according to the second aspect may have same functions and effects as those of the first aspect. Moreover, the battery holder is mounted on the battery holder portion, the printed circuit board is mounted on the board mount portion, the LCD is mounted on the LCD mount portion and the backlight is mounted on the backlight mount portion, whereby the base may be mounted by the battery holder, the printed circuit board, the LCD and the backlight. The terminal block disposed on the base may reduce the number of parts, resulting in the manufacturing cost reduction without wasting time in the assembly process.

According to a third aspect of this invention, a battery reverse insertion preventing means is provided on the battery holder of the electronic component of the first or second aspect of the invention, whereby same functions and effects as those of the electronic component of the first aspect may be obtained and the reverse insertion as to positive and negative poles of the battery may be prevented.

According to a fourth aspect of this invention, the above-described electronic components are so modified that the battery holder includes a battery accommodation portion and a battery insertion opening at one side of the battery accommodation portion at a right angle to a display direction of the LCD, whereby the installation-and-draw of the battery into and from the battery accommodation portion is eased without hindrance by the LCD.

According to a fifth aspect of this invention, there is provided a control component according to the third aspect of the invention in which the battery reverse insertion preventing means includes a lower and upper guide portions disposed on an inner surface of a stand wall of the battery accommodation portion, a first slide contact point bringing a lower wall of the battery into slidable contact with the lower guide portion, a second slide contact point bringing a peripheral of the lower wall of the battery into a bottom wall of the battery accommodation portion, and a third slide contact point bringing an upper wall of the battery into contact with the upper guide portion so that the reversal insertion can be prevented by the relationship of the interval between the first and second slide contact points and the third slide contact point. According to this electronic component of the fifth aspect, in addition to the functions and effects of the electronic component of the first aspect, the battery may be accommodated into the battery accommodation portion as the battery is slantingly inserted between the upper and lower guide portions through the battery insertion opening of the battery holder by lowering a negative pole wall of the battery to bring the negative pole wall into slidable contact with the lower guide portion and the positive pole wall into slidable contact with the upper guide portion so as to bring a peripheral of the lower wall of the battery, viz., a step formed by the negative pole wall and a peripheral of the lower wall, into contact with the bottom portion of the battery accommodation portion. When the battery is drawn from the battery accommodation portion, its reverse manner is executed. Thus, the reverse insertion by the battery is prevented, and the replacement of the battery is eased.

The above-mentioned electronic components may employ a display including a switch portion, and a switch construction including at least two switch conductive patterns connected with the printed circuit board on a front wall of the display which serves as an electric contact portion associated with a switch actuator in the switch portion.

Alternatively, the above above-mentioned electronic components may employ a display including a switch portion, and a switch construction having a switch conductive pattern which is disposed on a front wall of the display connected with the printed circuit board through a flexible wiring plate and connected with at least two wiring patterns of the flexible wiring plate, in which the switch conductive pattern serves as an electric contact portion associated with a switch actuator in the switch portion.

Moreover, the switch construction may be so constructed that a plurality of electrode terminal portions, at least two conductive patterns and a switch conductive pattern conductive with the conductive patterns are formed near a peripheral of a front wall of the display, and one end of the flexible wiring plate is bonded with the peripheral of the front wall of the display to connect the plurality of wiring patterns of the flexible wiring plate with the plurality of electrode terminal portions and connect at least two of the wiring patterns with the conductive patterns.

BRIEF DESCRIPTION OF THE DRAWINGS

Other objectives and advantages of this invention will be more readily apparent from the following detailed description provided in conjunction with the following figures, of which.

DETAILED DESCRIPTION OF THE PREFERRED EMBODIMENTS

Figure 1:
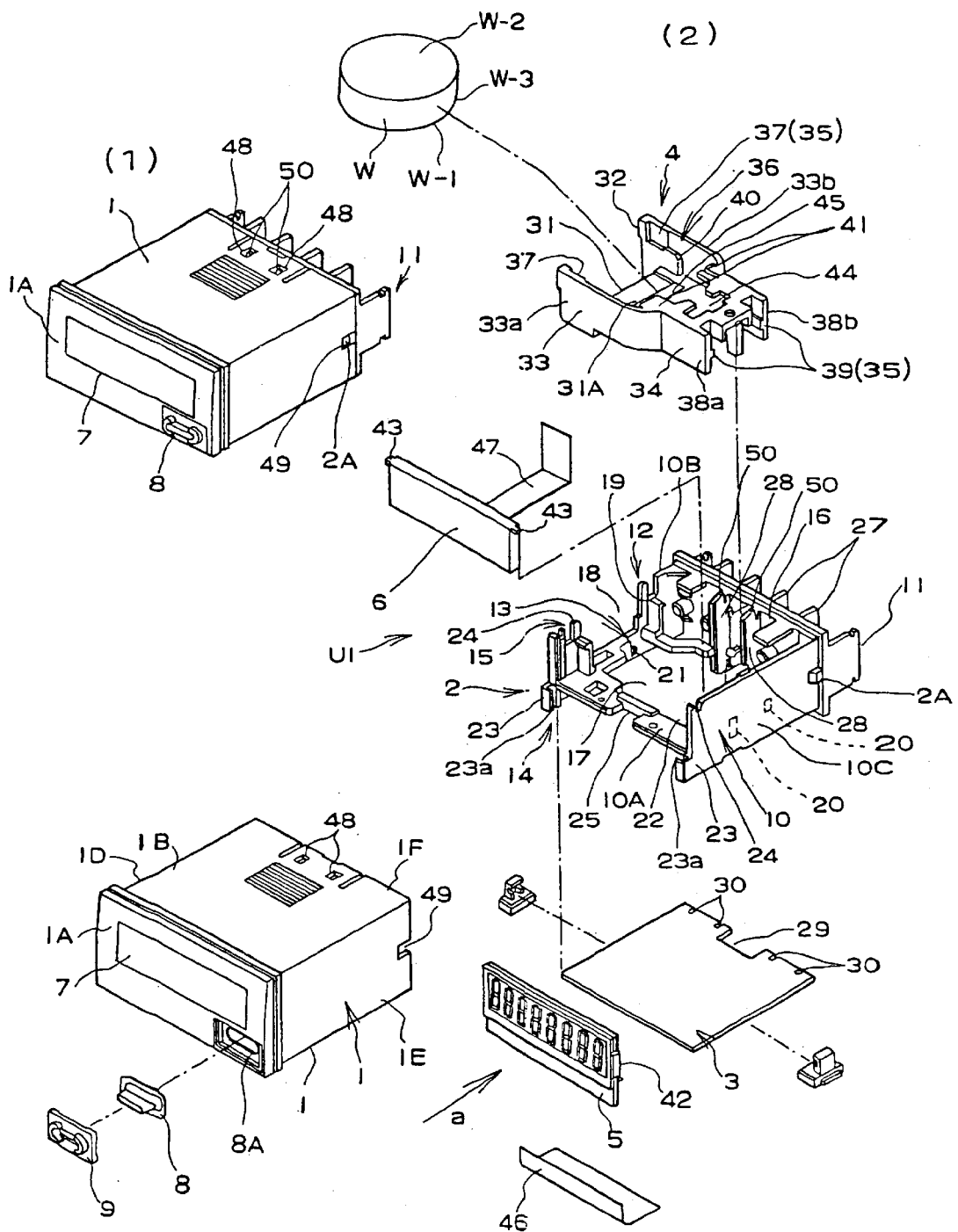
FIG. 1 shows at (1) a perspective view of a counter device as an electronic component of according to a first embodiment of this invention, and at (2) a disassembled view of the counter device.

Referring, now, to FIG. 1, there is shown a counter device as an electronic component according to a first embodiment of this invention, which includes an outer housing 1 and a control unit U1. The control unit U1 includes a base 2, a printed circuit board 3, a battery holder 4, an LCD 5, and a backlight unit 6.

The outer housing 1 is of a boxed-shape and includes a front wall 1A, upper and lower walls 1B and 1C, left and right walls 1D and 1E, and a rear opening. The front wall 1A is provided with a rectangular window 7 and a switch mount opening 8A mounted by a reset switch button 8 covered with a switch cover 9. A pair of engagement holes 48 are disposed on each of rear portion of the upper and lower walls 1B and 1C, and an engagement recess 49 is disposed on each rear edge of the left and right walls 1D and 1E. The base 2 includes a base portion 10 and a terminal block 11. The base portion 10 is provided with a battery holder mount portion 12, a board mount portion 13, a LCD mount portion 14, a backlight mount portion 15, and a terminal mount portion 16.

The battery holder mount portion 12 is formed by a bottom wall 10A and left and right walls 10B and 10C of the base portion 10. The bottom wall 10A is provided with an opening 17, and the left wall 10B is provided with an insertion opening 18 of a cut shape. A pair of engagement nails 19 stand across the opening 17 on a left side of the bottom wall 10A. A pair of engagement hooks 20 are disposed on an inner surface of the right wall 10C.

The board mount portion 13 includes a pair of front and back engagement nails 21 internally standing from the bottom wall 10A at a lower position of the left and right walls 10B and 10C, a pair of separation walls 28 disposed on an inner surface of a rear wall 10D of the base portion 10, and engagement projections 50 on upper ends of the separation walls 28. The LCD mount portion 14 includes a pair of insertion grooves 23a vertically formed on front positions 23 of the left and right walls 10B and 10C across a front opening 22 of the base portion 10. The backlight mount portion 15 includes engagement recesses 24 formed on upper ends of the front positions 23 of the left and right walls 10B and 10C and a hit portion 25 disposed on a front side of the bottom wall 10A.

The terminal mount portion 16 includes a plurality of terminal insertion holes 26 (see FIG. 3) formed on the rear wall 10D of the base portion 10, and separation portions 27 disposed on an outer surface of the rear wall 10D. The printed circuit board 3 includes a positioning portion 29 which is a cut portion at a middle of a rear edge thereof, and terminal insertion recesses 30 on the rear edge.

The battery holder 4 includes a battery accommodation portion 31, and a battery insertion opening 32 on a left side of the portion 31, and a stand wall 33 continuously formed on front, back and right sides of the battery accommodation portion 31. The stand wall 33 on its right-hand side is also provided with an engagement formation portion 34. The battery holder 4 is also provided with an engagement portion 35, a battery reverse insertion prevention portion 36, and positive and negative pole terminals 44 and 45.

The engagement portion 35 includes engagement recesses 37 formed on inner surfaces of both sides 33a and 33b of the stand wall 33, and engagement projections 39 formed on inner surfaces of front and back walls 38A and 38B of the engagement formation portion 34.

The battery reverse insertion prevention portion (battery reverse insertion preventing means) 36 includes a pair of lower guide portions 40 formed on inner surfaces of tip ends (left-hand side) of both sides 33a and 33b of the stand wall 33, and a pair of upper guide portions 41 formed on rear sides (right-hand side) of the both sides 33a and 33b of the stand wall 33. A corner of the lower guide portion 40 is formed to be slant. The upper guide portion 41 is composed of leads 41a and 41b (see FIG. 2) formed on upper edges of the both sides 33a and 33b to cover the battery accommodation portion 31. A positive pole terminal 44 is fixed to an upper edge of a right-hand side of the stand wall 33 to project toward an upper direction of the battery accommodation portion 31. A negative pole terminal 45 is disposed on the bottom wall 31A of the battery accommodation portion 31.

The LCD 5 is provided with a stopper 42 on each of its front and back edges, and the backlight unit 6 is provided with engagement projections 43 on an upper edge of the front and rear sides of the unit 6. The board mount portion 13 of the base 2 is inserted by the printed circuit board 3 from the front, the positioning portion 29 of the rear edge of the board 3 is engaged with the pair of separation walls 28, and the left and right edges of the printed circuit board 3 are engaged with the engagement nails 21.

The battery holder mount portion 12 of the base is mounted by the battery holder 4. The engagement recesses 37 of the battery holder 4 is removably engaged with the pair of engagement nails 19 of the base 2, the pair of engagement projections 39 on the right-hand side of the battery holder 4 are removably engaged with the pair of engagement hooks 20 of the base 2 to mount the battery holder 4 on the base 2. The battery insertion opening 32 of the battery holder 4 is inserted into a cut shape insertion opening 18, and directed in left of the base 2, viz., toward right angle direction to a display direction "a" of LCD 5. Each lead portion (not shown in drawings) of the positive electrode terminal 44 and the negative electrode terminal 45 is connected with an electrical conduction pattern (not shown in drawings) of the printed circuit board 3.

The LCD 5 is mounted on the LCD mount portion 14 of the base 2. In this case, the both side edges of LCD 5 are inserted into the pair of insertion grooves 23a, and stoppers 42 come into contact with the upper edges of the insertion grooves 23a. The LCD 5 is connected with an electrical conduction pattern (not shown in drawings) of the printed circuit board 3 through a heat seal 46 serving as a flexible wiring plate.

The backlight unit 6 is removably put on the backlight mount portion 15 of the base 2. The engagement projections 43 of the backlight unit 6 are removably engaged with the engagement recesses 24 of the base 2, a lower edge of the backlight unit 6 comes into contact with the hit portion 25. A flexible printed wiring circuit board FPC4 connected with the backlight unit 6 is connected with an electrical conduction pattern (not shown in drawings) of printed circuit board 3.

Figure 8:
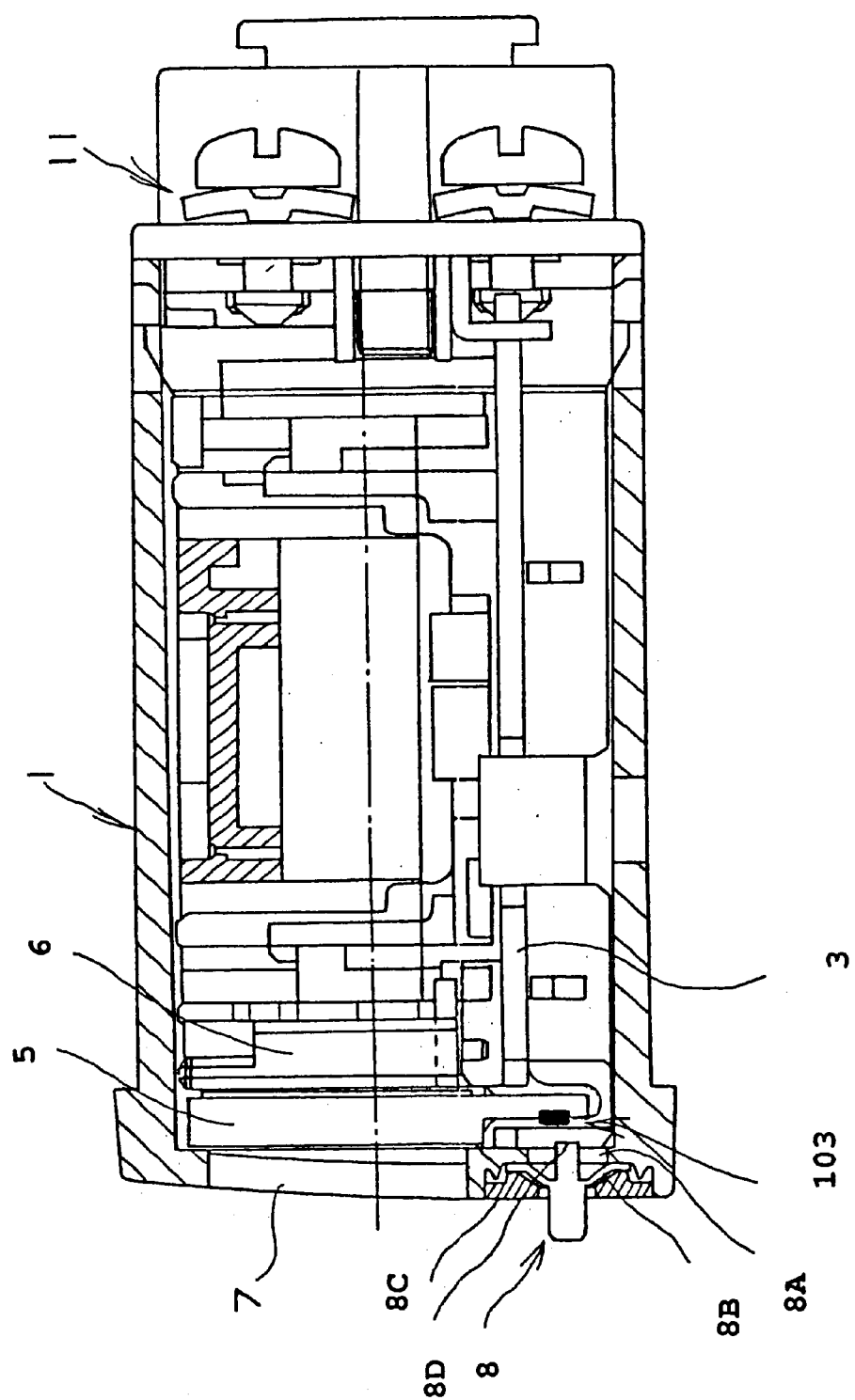
FIG. 8 a longitudinal sectional view of the counter device of FIG. 1.

The window 7 and the switch mount opening 8A are disposed at the front wall 1A of the outer housing 1. The reset switch button 8 made of rubber as a switch section is mounted in the switch mount opening 8A, and includes a dish-shaped spring 8B as shown in FIG. 8. The dish-shaped spring 8B comes along a step of the switch mount opening 8A, and a suppress member 8C is engaged with the switch mount opening 8A to hold the dish-shaped spring 8B. A rear end of the switch button 8 is applied by carbon to play as a switch actuator 8D.

Figure 9:
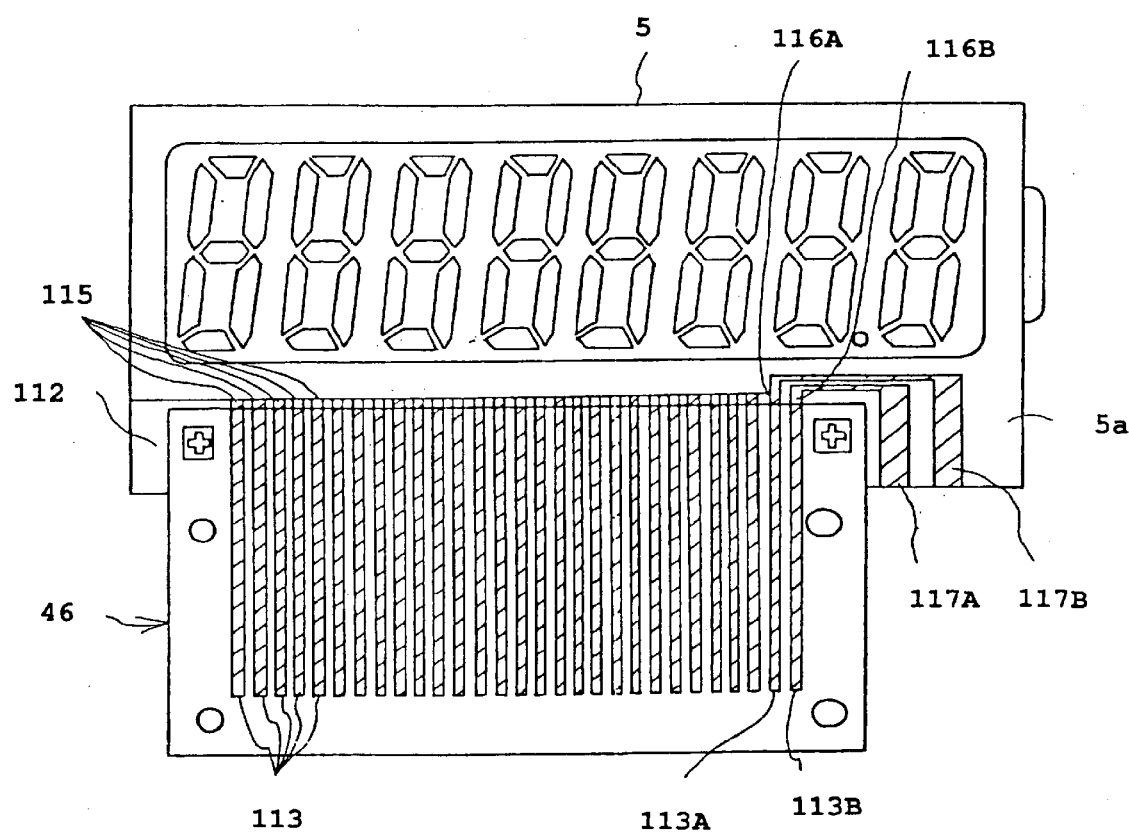
FIG. 9 is a front view of an LCD and a heat sheet which are connected each other and employed in the counter device of FIG. 8.
Figure 10:
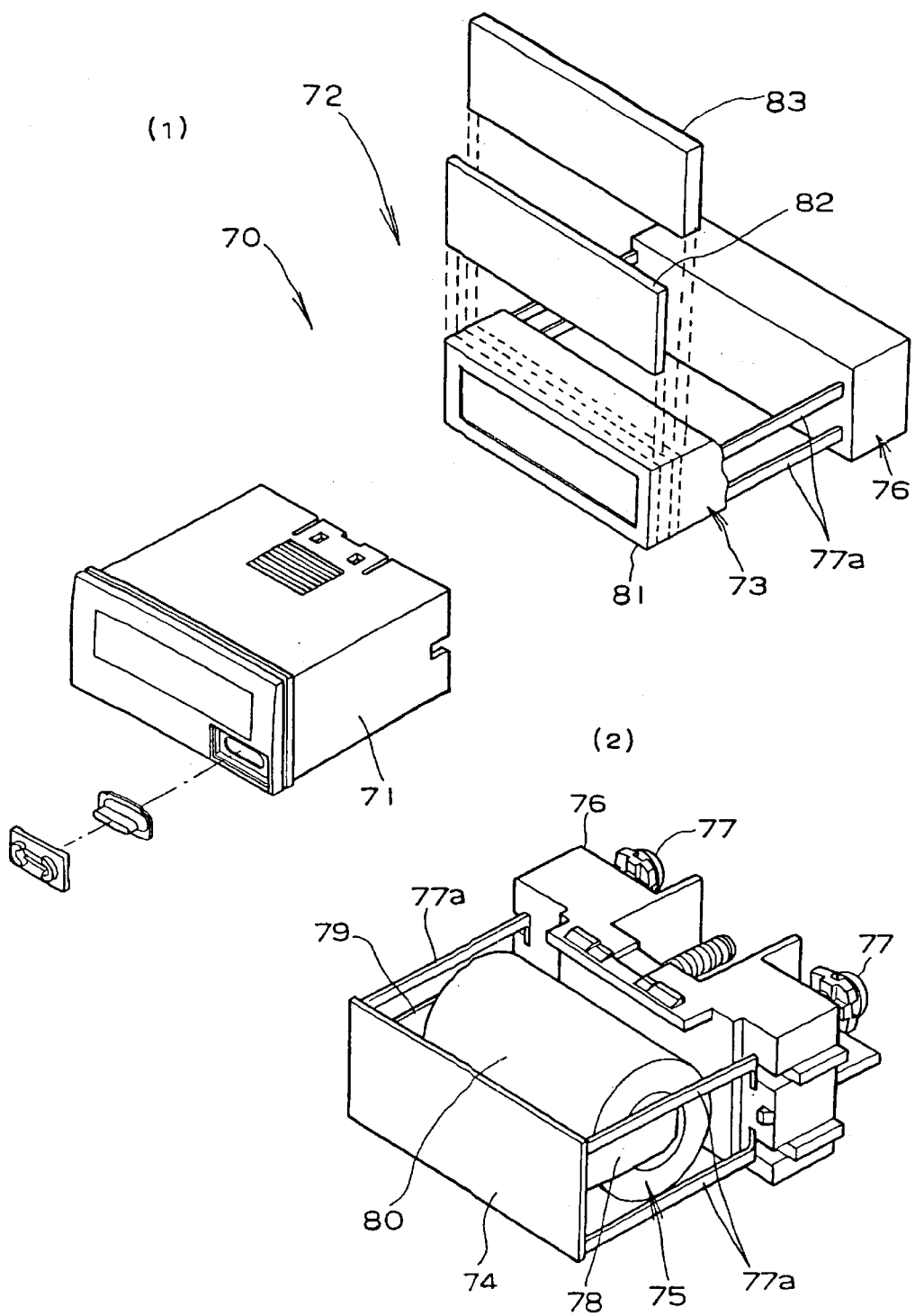
FIG. 10 shows at (1) a perspective disassembled view of a conventional counter device and at (2) a partially omitted perspective view of a control unit employed in the conventional counter.

As shown in FIG. 9, the LCD 5 is a plate of a rectangular shape along an inner surface of the front of the outer housing 1, and an electrical conductive pattern portion 112 is disposed along a lower part of a front wall 5a of the LCD 5. The electrical conductive pattern portion 112 is provided with a plurality of electrode terminals 115 having a pattern for connection with electrodes of the LCD 5 in a right-and-left direction. In the electrical conductive pattern portion 112 there are disposed a pair of conductive patterns 116A and 116B formed on the right side of the electrode terminals 115, and a pair of switch conductive patterns (electrical contacts) 117A and 117B formed on the right side of the conductive patterns 116A and 116B, in which the electrical conductive patterns 116A and 116B are respectively connected with the switch conductive patterns 117B and 117A.

The flexible wiring plate 46 is made by coating a heat seal, viz., a micromolecule film (generally, polyester film) 114 having a plurality of wiring patterns 113 with resin for thermocompression bonding. A pair of wiring patterns 113A and 113B in the plurality of wiring patterns 113 of the flexible wiring plate 46 serve as switch-wiring patterns.

Within the base 2, the LCD 5 is disposed at a front of the base, and the printed circuit board 3 is disposed behind the LCD 5.

A front end of the flexible wiring plate 46 is bonded with the conductive pattern portion 112 of the LCD 5, the wiring patterns 113 are connected with the electrode terminals 115, and the pair of wiring patterns 113A and 113B are connected with the conductive patterns 116A and 116B. A rear end of the flexible wiring plate 46 is bonded with a part mount surface of the printed circuit board 3, and the wiring patterns 113, 113A and 113B are connected with conductive patterns (not shown in drawings) formed on the part mount surface of the printed circuit board 3.

The switch actuator 8D of the switch button 8 of the reset switch is positioned before the switch patterns 117A and 117B of the conductive pattern portion 112 of the LCD 5.

Upon depressing the reset switch button 8, the switch button 8 is moved backward against the spring force of the dish-shaped spring 8B to bring the switch actuator 8D of the switch button 8 into contact with the conductive pattern portion 112 of the LCD 5 and short-circuit between the switch conductive patterns 117A and 117B of the conductive pattern portion 112 to be turned on. Upon release of the depression to the reset switch button 8, the switch button 8 is moved forward by the spring force of the dish-shaped spring 8B to separate the switch actuator 8D from a glass face portion 5a and break the short circuit between the switch conductive patterns 117A and 117B to be turned off.

Figure 2:
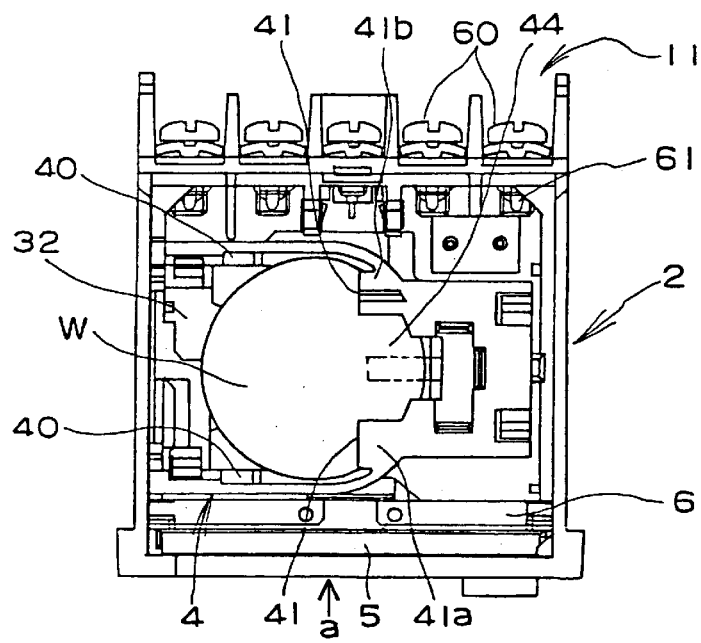
FIG. 2 is a top view of a control unit employed in the counter device.

Return into FIGS. 1 and 2, the terminal mount portion 16 is mounted by the terminals 60 by inserting the same into the plurality of insertion holes 26, and the lead portions 61 of the terminals 60 (see FIG. 2) are inserted into the terminal insertion recesses 30 of the printed circuit board 3 for pattern connection.

Figure 3:
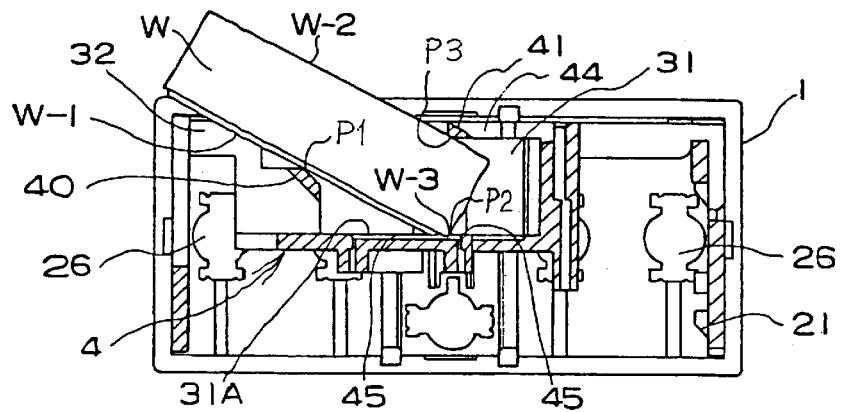
FIG. 3 is a sectional view of the control unit to show an installation of a battery into the unit.
Figure 4:
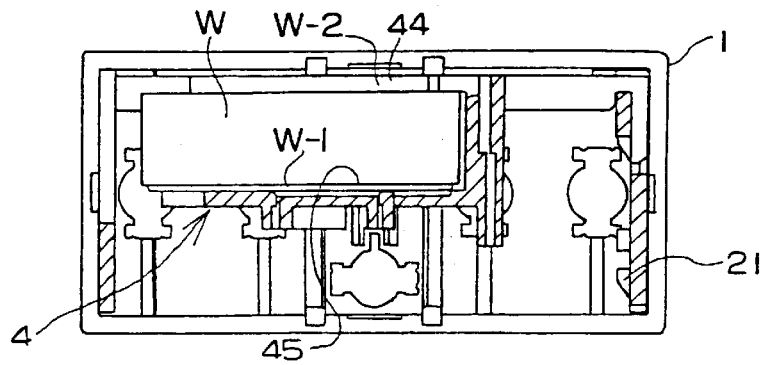
FIG. 4 is a sectional view of the control unit in which the battery is inserted.

Thus constructed control unit U1 is installed by a coin-shaped battery W. As shown in FIG. 3, the battery W is slatingly inserted between the upper and lower guide portions 41 and 40 through the battery insertion opening 32 lowering the negative pole wall W-1. The negative pole wall W-1 of the battery W slides on the lower guide portion 40 and the positive pole wall W-2 slides below the upper guide portion 41 to bring a peripheral (a step made by the negative pole wall W-1 and the positive pole wall W-2) W-3 of the negative pole wall W-1 on a tip side of the battery W into contact with the bottom wall 31A of the battery accommodation portion 31.

As the battery W is further pushed in, the battery W slides over a first slide contact point P1 of the lower guide portion 40 against the negative pole wall W-1, a third slide contact point P3 of the upper guide portion 41 against the positive pole wall W-2, and a second slide contact point P2 of the bottom portion 31A against the peripheral W-3 of the negative pole wall W-1 to be accommodated into the battery accommodation portion 31. Upon the complete accommodation of the battery W into the accommodation portion 31, the positive and negative pole terminals 44 and 45 are respectively brought into contact with the positive and negative pole walls W-2 and W-1. The distance between the first and second slide contact points P1 and P2 varies with the difference between the shapes of the positive and negative pole terminals 44 and 45 of the battery W, and any reverse insertion of the battery is prevented by the relation of the difference and the third slide contact point P3.

The control unit U1 enclosing the battery W within the battery accommodation portion 31 is inserted into the outer housing 1 from the opening 1F at the rear end thereof, and the LCD 5 is positioned behind the window 7 of the front wall 1A. The engagement projections 2A projecting from the left and right walls 10B and 10C of the base 2 are engaged with the engagement recesses 49, and the engagement projections 50 of the upper ends of the pair of separation walls 28 of the base 2 are engaged with the pair of engagement holes 48.

Figure 5:
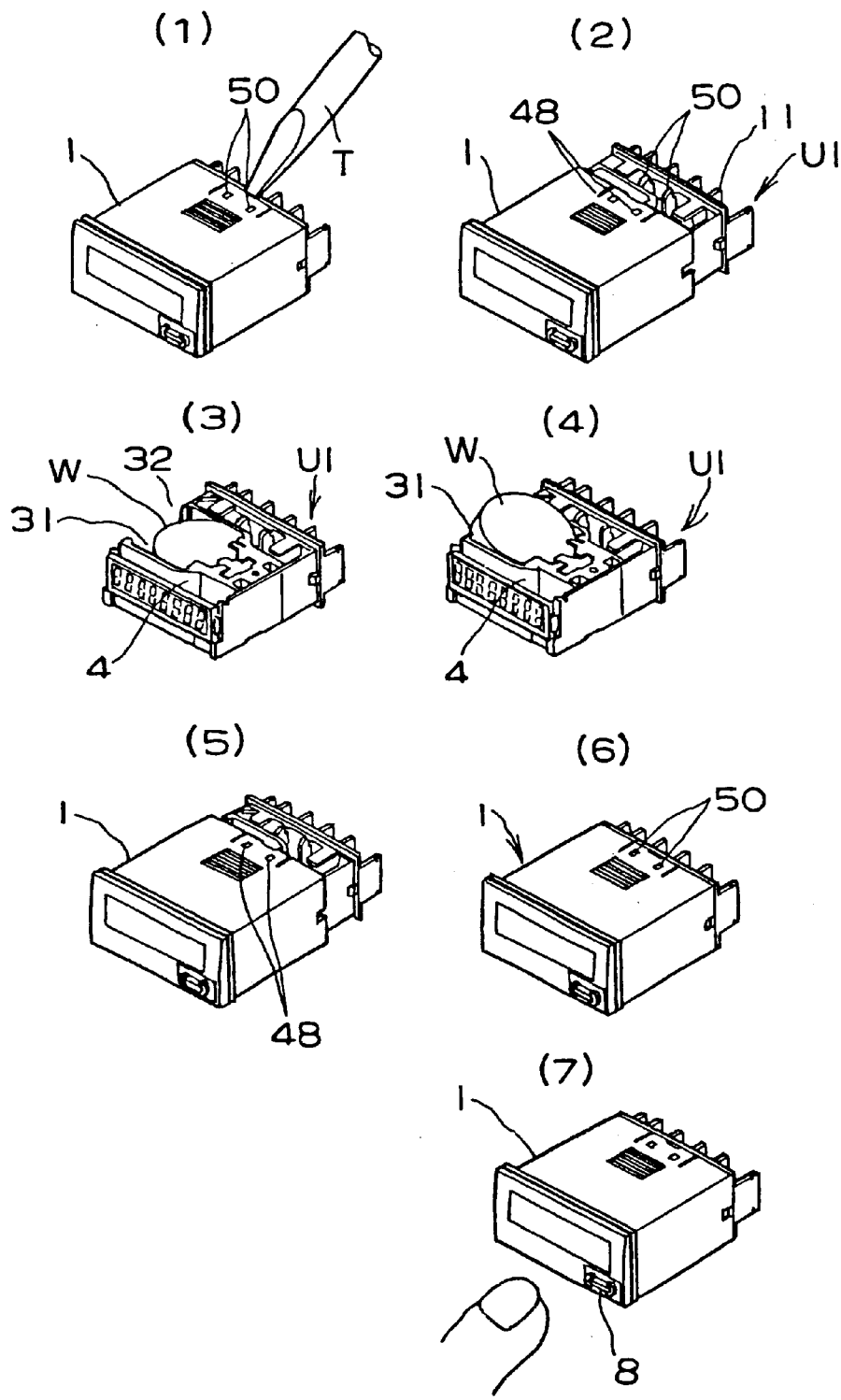
FIG. 5 at (1) to (7) shows a process of replacement of a battery.

In FIG. 5 at (1) to (7), there is shown a replacement process of the battery W. First, as shown in FIG. 5 at (1) and (2), the engagement projections 50 are disengaged from the pair of engagement holes 48 by using a tool T to pull out the control unit U1 from the outer housing 1. As shown in FIG. 5 at (3) and (4), the accommodated battery W is pull out from the battery insertion opening 32 in a reverse process of the above-mentioned insertion process, and a new battery W is inserted into the battery accommodation portion 31 through the battery insertion opening 32 in the above-mentioned insertion. Next, at shown in FIG. 5 at (5) and (6), the control unit U1 is inserted into the outer housing 1 to engage the engagement projections 50 with the pair of engagement holes 49 to finish the assembling, and as shown in FIG. 5 at (7) the reset button 8 is actuated.

Thus, according to this first embodiment, the base 2 is composed of the base portion 10 and the terminal block portion 11, wherein the base portion 10 is provided with the battery holder mount portion 12, the board mount portion 13, the LCD mount portion 14, and the backlight mount portion 15, the board mount portion 13 is provided with the printed circuit board 3, the battery holder mount portion 12 is provided with the battery holder 4 holding the battery W, whereby the replacement of the battery W is eased, the sufficient insulation distance between the battery W and the electronic parts on the printed circuit board 3 is ensured, it is not necessary to arrange the electronic parts on the printed circuit board 3 to ensure a sufficient insulation distance between the battery W and the electronic parts, and the necessity of any broad arrangement space for the electronic parts may be avoided. The LCD 5 and the backlight 6 are assembled into the base 2 at the LCD mount portion 14 and the backlight mount portion 15, whereby any front module may be omitted and the number of parts may be decreased, resulting in manufacturing cost reduction without wasting time in the assembly process. The disposition of the terminal block 11 on the base 2 allows the number of the parts to be reduced, resulting in its manufacturing cost reduction without wasting time in the assembling process.

Figure 6:
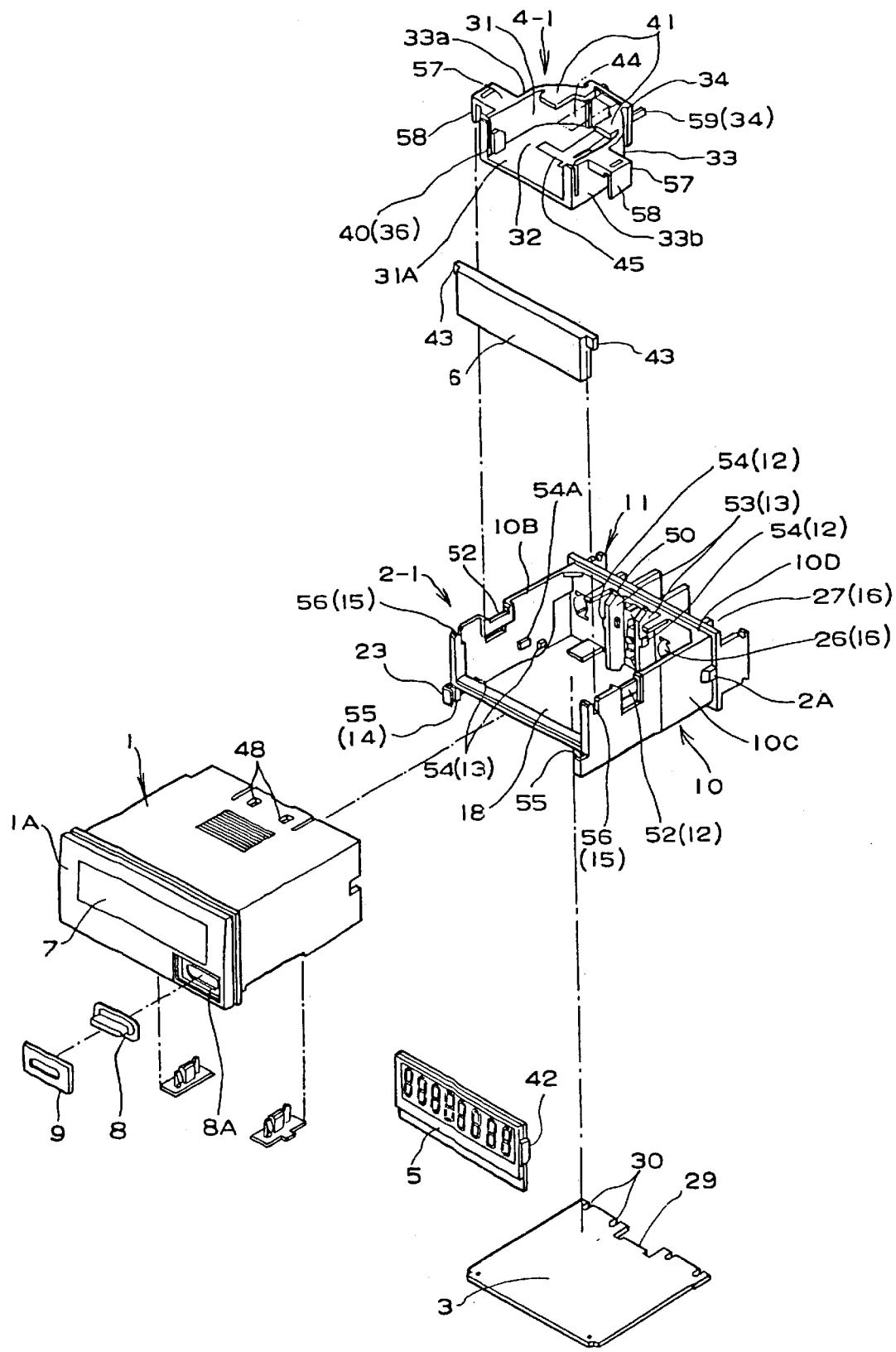
FIG. 6 is a perspective disassembled view of a counter device as a second embodiment of this invention.
Figure 7:
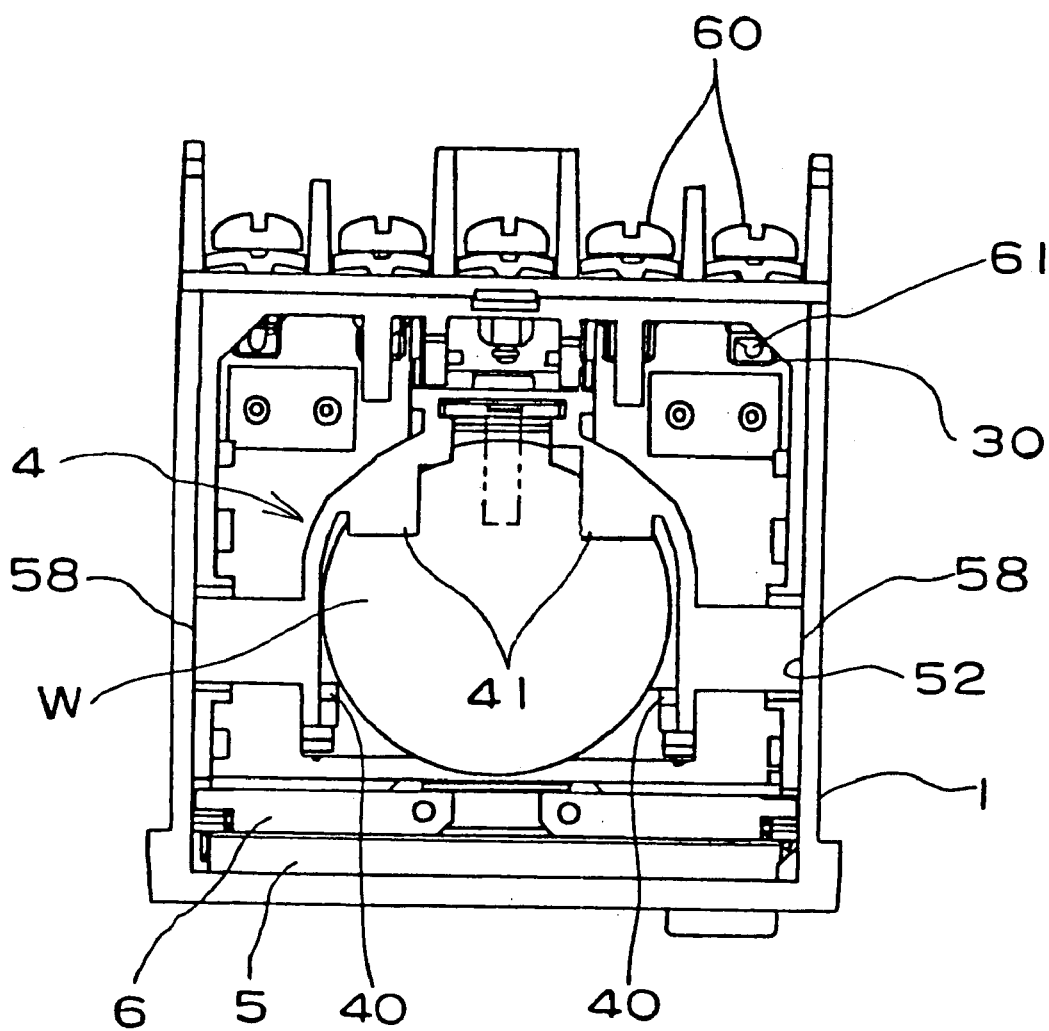
FIG. 7 is a top view of a control unit employed in the counter device of FIG. 6.

In FIG. 6, there is shown a disassembled perspective view of a counter device as an electronic component according to a second embodiment of this invention. FIG. 7 shows a top view of a control unit U1 of the counter device of FIG. 6. In the counter device of this second embodiment, same components as those of the counter device of the first embodiment are represented by the same reference symbols. The control unit U1 of this embodiment is different from that of the first embodiment by having a different construction about a base 2-1 and a battery holder 4-1 from that of the first embodiment.

The battery holder 4-1 is so positioned in the base that a battery insertion opening 32 is positioned on a front side of the base 2-1 composed of a base portion 10 and a terminal block 11. The base portion 10 is provided with a battery holder mount portion 12, a board mount portion 13, a LCD mount portion 14, a backlight mount portion 15, and a terminal mount portion 16.

The battery holder mount portion 12 is provided with a pair of engagement portions 52 formed on upper edges of left and right walls 10B and 10C of the base portion 10, and engagement hooks 54 disposed on external faces of a pair of separation walls 53 formed on an inner face of a rear wall 10D of the base portion 10.

The board mount portion 13 includes a pair of front and back engagement nails 54 and 54A standing on left and right walls 10B and 10C, a pair of separation walls 53 disposed on an inner face of the rear wall 10D of the base portion 10. The LCD mount portion 14 includes a pair of insertion grooves 55 vertically formed on front positions 23 of the left and right walls 10B and 10C across a front opening 22 of the base portion 10. The backlight mount portion 15 includes engagement recesses 56 formed on upper ends of the front positions 23 of the left and right walls 10B and 10C.

A terminal mount portion 16 includes a plurality of terminal insertion holes 26 formed on the rear wall 10D of the base portion 10, and separation portions 27 disposed on an outer surface of the rear wall 10D.

The battery holder 4-1 includes a battery accommodation portion 31, and the battery insertion opening 32 on a left side of the portion 31, and a stand wall 33 continuously formed on left, right and rear sides of the battery accommodation portion 31. The stand wall 33 on its rear side is also provided with an engagement formation portion 34. The battery holder 4-1 is also provided with an engagement portion 35, a battery reverse insertion prevention portion 36, and positive and negative pole terminals 44 and 45.

The engagement portion 35 includes engagement leads 57 formed on external surfaces of both sides 33a and 33b of the stand wall 33, and engagement nails 58 are disposed on tips of the engagement leads 57. A pair of engagement nails 59 are formed on the engagement formation portion 34.

The battery reverse insertion prevention 36 includes a pair of lower guide portions 40 formed on inner surfaces of front sides of both sides 33a and 33b of the stand wall 33, and a pair of upper guide portions 41 formed on rear sides of the both sides 33a and 33b of the stand wall 33. A corner of the lower guide portion 40 is formed to be slant. The upper guide portion 41 is composed of leads formed on upper edges of the both sides 33a and 33b to cover the battery accommodation portion 31. A positive pole terminal 44 is fixed to an upper edge of a rear side of the stand wall 33 to project toward an upper direction of the battery accommodation portion 31. A negative pole terminal 45 is disposed on the bottom wall 31A of the battery accommodation portion 31.

The board mount portion 13 of the base 2-1 is inserted by the printed circuit board 3 from the front, the positioning portion 28 of the rear edge of the board 3 is engaged with the pair of separation walls 53, and the left and right edges of the printed circuit board 3 are engaged by the engagement nails 54 and 54A.

The battery holder mount portion 12 of the base 2-1 is mounted by the battery holder 4-1. The engagement recesses 52 of the battery holder 4-1 is removably engaged with the engagement nails 58 of the base 2-1, the pair of engagement nails 59 on the rear side of the battery holder 4-1 are removably engaged with the engagement hooks 54 of the base 2-1 to mount the battery holder 4-1 on the base 2-1. The battery insertion opening 32 of the battery holder 4-1 is inserted into a cut shape insertion opening 18 of the base 2-1, and directed toward a front face of the base 2-1. Each lead portion (not shown in drawings) of the positive electrode terminal 44 and the negative electrode terminal 45 is connected with an electrical conduction pattern (not shown in drawings) of the printed circuit board 3.

The LCD 5 is mounted on the LCD mount portion 14 of the base 2-1. In this case, the both side edges of LCD 5 are inserted into the pair of insertion grooves 55, and stoppers 42 come into contact with the upper edges of the insertion grooves 55. The LCD 5 is connected with an electrical conduction pattern (not shown in drawings) of the printed circuit board 3 through a heat seal (not shown in drawings).

The backlight unit 6 is removably put on the backlight mount portion 15 of the base 2-1. The engagement projections 43 on the front and rear sides of the backlight unit 6 are removably engaged with the engagement recesses 56 of the base 2-1. A flexible printed wiring circuit board FPC (not shown in drawings) connected with the backlight unit 6 is connected with an electrical conduction pattern (not shown in drawings) of the printed circuit board 3.

The terminal mount portion 16 is mounted by the terminals 60 by inserting the same into the plurality of insertion holes 26, and the lead portions 61 of the terminals 60 (see FIG. 7) are inserted into the terminal insertion recesses 30 of the printed circuit board 3 for pattern connection.

Thus constructed control unit U1 is installed by a coin-shaped battery W. In the same manner as that of the first embodiment shown in FIG. 3, the battery W is slantingly inserted between the upper and lower guide portions 41 and 40 through the battery insertion opening 32 of the battery holder 4-1 lowering the negative pole wall W-1 of the battery W. The negative pole wall W-1 of the battery W slides on the lower guide portion 40 and the positive pole wall W-2 slides below the upper guide portion 41 to bring a peripheral (a step made by the negative pole wall W-1 and the positive pole wall W-2) W-3 of the negative pole wall W-1 on a tip side of the battery W into contact with the bottom wall 31A-1 of the battery accommodation portion 31.

As the battery W is further pushed in, the battery W slides over a first slide contact point P1 of the lower guide portion 40 against the negative pole wall W-1, a third slide contact point P3 of the upper guide portion 41 against the positive pole wall W-2, and a second slide contact point P2 of the bottom wall against the peripheral W-3 of the negative pole wall W-1 to be accommodated into the battery accommodation portion 31. Upon the complete accommodation of the battery W into the accommodation portion 31, the positive and negative pole terminals are respectively brought into contact with the positive and negative pole walls W-2 and W-1.

The control unit U1 enclosing the battery W within the battery accommodation portion 31 is inserted into the outer housing 1 from the opening 1F at the rear end thereof, and the LCD 5 is positioned behind the window 7 of the front portion 1A. The engagement projections 2A projecting from the left and right walls 10B and 10C of the base 2-1 are engaged with the engagement recesses 49, and the engagement projections 50 of the upper end of the pair of separation walls 28 of the base are engaged with the pair of engagement holes 48.

Thus, according to this second embodiment, the base 2-1 is composed of the base portion 10 and the terminal block portion 11, the base portion 10 is provided with the battery holder mount portion 12, the board mount portion 13, the LCD mount portion 14, and the backlight mount portion 15, the board mount portion 13 is provided with the printed circuit board 3, the battery holder mount portion 12 is provided with the battery holder 4-1 holding the battery W, whereby the replacement of the battery W is eased, the sufficient insulation distance between the battery W and the electronic parts on the printed circuit board 3 is ensured, it is not necessary to arrange the electronic parts on the printed circuit board 3 to ensure a sufficient insulation distance between the battery W and the electronic parts, and the necessity of any broad arrangement space for the electronic parts may be avoided. The LCD 5 and the backlight 6 are assembled into the base 2-1 at the LCD mount portion 14 and the backlight mount portion 15, whereby any front module may be omitted and the number of parts may be decreased, resulting in manufacturing cost reduction without wasting time in the assembly process. The disposition of the terminal block 11 on the base 2-1 allows the number of the parts to be reduced, resulting in the manufacturing cost without wasting time in the assembling process.

Thus, the above-mentioned switch construction according to this invention may be applied to various control components. While this invention has been described and illustrated with respect to certain embodiments which give satisfactory results, it will be understood by those skilled in the art, after understanding the purpose of the invention, that various other changes and modifications may be made without departing from the spirit and scope of the invention, and it is therefore, intended in the appended claims to cover all such changes and modifications.

What is claimed is:

1. An electronic counter device comprising an outer housing and a control unit inserted within the outer housing, said control unit including:

a base including a terminal block, a printed circuit board mounted on said base, a battery holder mounted on said base for removably holding a coin-shaped battery which includes terminals connected with said printed circuit board to be connected with positive and negative poles of said battery, a liquid crystal display mounted on said base and connected with said printed circuit board, said battery holder including a battery accommodation portion for holding said coin-shaped battery and a battery insertion opening at one side of said battery accommodation portion at a right angle to a display direction of said liquid crystal display, and a backlight unit mounted on said base and connected with said printed circuit board, and wherein the battery holder is arranged between the liquid crystal display and the terminal block.

2. An electronic counter device according to claim 1, in which said base includes a base portion, and said base portion includes battery holder mount portion for mounting said battery holder, a board mount portion for mounting said printed circuit board, a liquid crystal display mount portion for mounting said liquid crystal display, and a backlight mount portion for mounting said backlight unit.

3. An electronic counter device according to claim 1, in which said battery holder includes a battery reverse insertion preventing means.

4. An electronic counter device according to claim 3, in which said battery reverse insertion preventing means includes lower and upper guide portions disposed on an inner surface wall of a stand wall of said battery accommodation portion, a first slide contact point bringing a lower wall of said battery into slidable contact with said lower guide portion, a second slide contact point bringing a peripheral of the lower wall of said battery into a bottom wall of said battery accommodation portion, and a third slide contact point bringing an upper wall of said battery into contact with said upper guide portion so that the reversal insertion can be prevented by the relationship of the interval between the first and second slide contact points and the third slide contact point.

5. An electronic counter device according to claim 1, wherein said display includes a switch portion, and a switch construction having at least two switch conductive patterns disposed on a front wall of said display connected with said printed circuit board which serves as an electronic contact portion associated with a switch actuator in said switch portion.

6. An electronic counter device according to claim 1, wherein said display includes a switch portion, and a switch construction having a switch conductive pattern which is disposed on a front wall of said display connected with said printed circuit board through a flexible wiring plate and connected with at least two wiring patterns of said flexible wiring plate, said switch conductive pattern serving as an electric contact portion for contacting a switch actuator in said switch portion.

7. An electronic counter device according to claim 6, including a switch construction in which a plurality of electrode terminal portions, at least two conductive patterns and a switch conductive pattern conductive with said conductive patterns are formed near a peripheral of a front wall of said display, and one end of said flexible wiring plate is bonded with the peripheral of said front wall of said display to connect said plurality of wiring patterns of said flexible wiring plate with said plurality of electrode terminal portions and connect at least two of said wiring patterns with said conductive patterns.

8. An electronic counter device according to claim 1, wherein the terminal block includes a plurality of screw terminals.

9. An electronic counter device according to claim 1, wherein the battery holder is for removably holding a coin shaped battery having a top flat surface, and wherein top flat surface is perpendicular to the liquid crystal display, when seated in the battery holder.

10. An electronic counter device according to claim 1, wherein the printed circuit board is mounted on the base and is perpendicular to both the liquid crystal display and the terminal block.

11. An electronic counter device according to claim 1, wherein the printed circuit board includes electronic components on one side, and the battery holder is arranged on another side of the printed circuit board opposite to the one side.

* * * * *